(12) United States Patent
Sun Wei et al.

(10) Patent No.: US 7,486,143 B2
(45) Date of Patent: Feb. 3, 2009

(54) CIRCUIT FOR BIASING A TRANSISTOR AND RELATED SYSTEM AND METHOD

(75) Inventors: John Shi Sun Wei, Cupertino, CA (US); Hans Rohdin, Los Altos, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 84 days.

(21) Appl. No.: 11/525,759

(22) Filed: Sep. 22, 2006

(65) Prior Publication Data
US 2008/0074193 A1   Mar. 27, 2008

(51) Int. Cl.
*H03F 3/04* (2006.01)
(52) U.S. Cl. .................................. 330/296; 330/290
(58) Field of Classification Search ............ 330/285, 330/296, 288
See application file for complete search history.

(56) References Cited

U.S. PATENT DOCUMENTS

| 6,753,734 | B2* | 6/2004 | Arell et al. ............ 330/296 |
| 7,057,462 | B2* | 6/2006 | Kang et al. ............ 330/289 |
| 7,064,614 | B2* | 6/2006 | Feng et al. ............ 330/296 |
| 2007/0040613 | A1* | 2/2007 | Chow et al. ............ 330/296 |

* cited by examiner

*Primary Examiner*—Robert Pascal
*Assistant Examiner*—Hieu P Nguyen (57) ABSTRACT

An embodiment of a circuit for biasing a transistor such as an amplifier transistor includes reference and bias nodes, and includes buffer, reference, and feedback stages. The reference node receives a reference current, and the bias node, which is for coupling to the transistor, carries a bias signal. The buffer stage buffers the reference node from the bias node. The reference stage generates the bias signal from the reference current, and the bias signal causes the transistor to conduct a bias current that is proportional to the reference current. And the feedback stage is coupled between the reference and bias nodes. As compared to known bias circuits, such a bias circuit may reduce the amplitude and duration of a transient overshoot in the bias current of a field-effect transistor when the DC component of the transistor's drain voltage transitions from one value to another value. Such a bias circuit may also reduce the difference between the values of the bias current through the transistor for different supply voltages. And such a bias circuit may reduce the difference between the predicted and actual values of the bias current through the transistor for a given input voltage such as that between the gate and the source of a field-effect transistor.

6 Claims, 7 Drawing Sheets

CIRCUIT FOR BIASING A TRANSISTOR AND RELATED SYSTEM AND METHOD

BACKGROUND

Typically, a transistor used to amplify a time-varying (AC) signal is biased at a predetermined quiescent (DC) operating point about which the amplified AC signal transitions.

Figure 1:
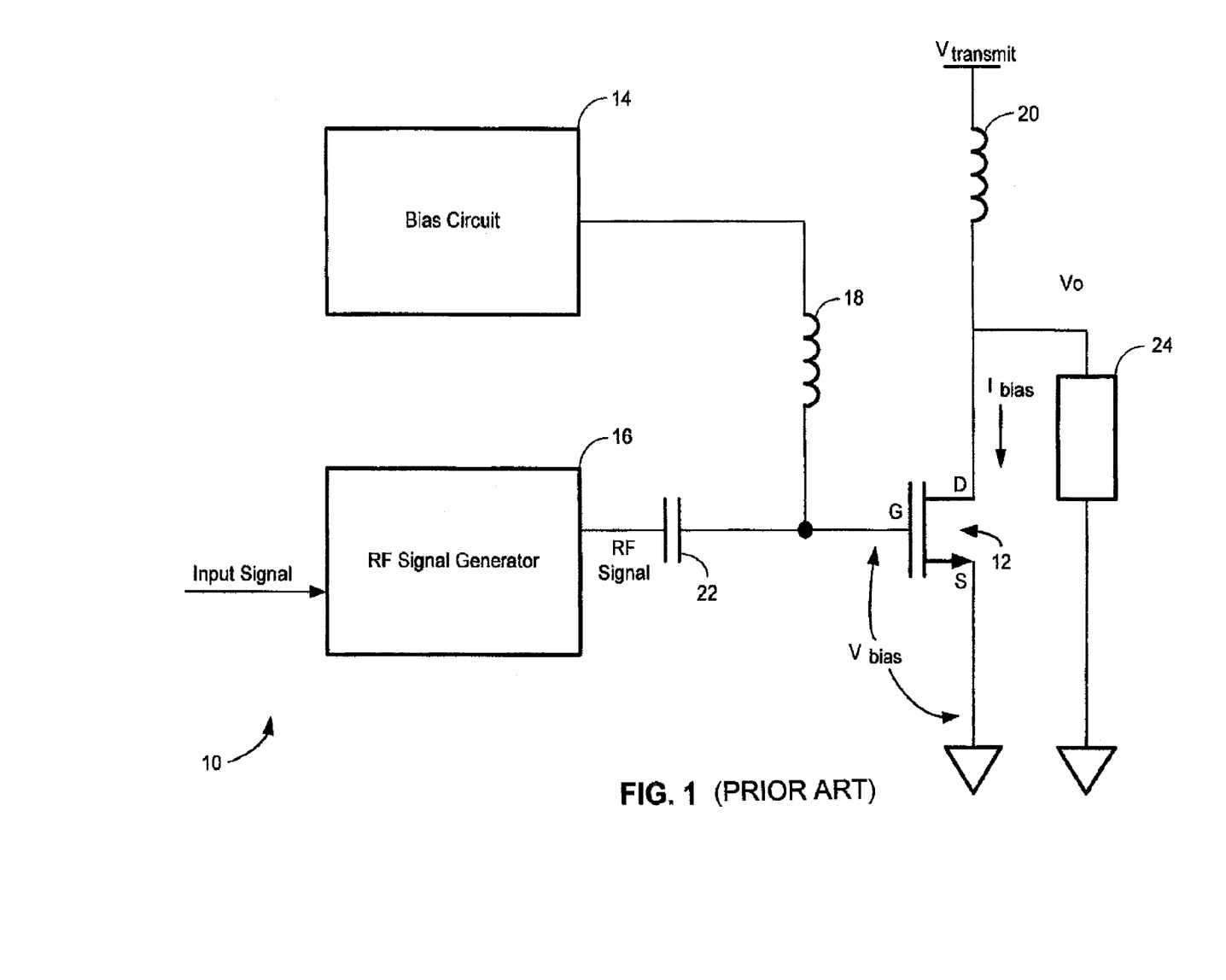
FIG. 1 is a diagram of a conventional RF amplifier stage.

FIG. 1 is a diagram of an amplifier stage 10 for an electronic system, such as a cell phone or wireless modem.

The amplifier stage 10 includes a biased amplifier transistor 12 for amplifying a radio-frequency (RF) signal for transmission to a remote receiver (not shown). The amplifier stage 10 also includes a circuit 14 for biasing the transistor 12, a generator 16 for generating the RF signal from an input signal, RF chokes 18 and 20, a DC blocking capacitor 22, and a load 24 across which the transistor generates the amplified RF signal Vo. If the amplifier stage 10 is an intermediate amplifier stage, then the input signal is a data signal or an intermediate RF signal from a previous amplifier stage, and the load 24 is a subsequent amplifier stage; alternatively, if the amplifier stage 10 is the final amplifier stage, then the load is an antenna.

The amplifier transistor 12 is a type III-IV (e.g., GaAs) field-effect transistor having a control node (here a gate G), a first conduction node (here a drain D), and a second conduction node (here a source S).

The bias circuit 14 generates a DC bias voltage $V_{bias}$ across the gate G and source S nodes of the transistor 12, and $V_{bias}$ causes the drain D of the transistor to sink a quiescent bias current $I_{bias}$; therefore, the RF current that the transistor draws to generate Vo transitions about $I_{bias}$.

The choke 18 isolates the bias circuit 14 from the RF signal, the choke 20 isolates the supply $V_{transmit}$ from Vo, and the capacitor 22 isolates the generator 16 from $V_{bias}$.

Figure 2:
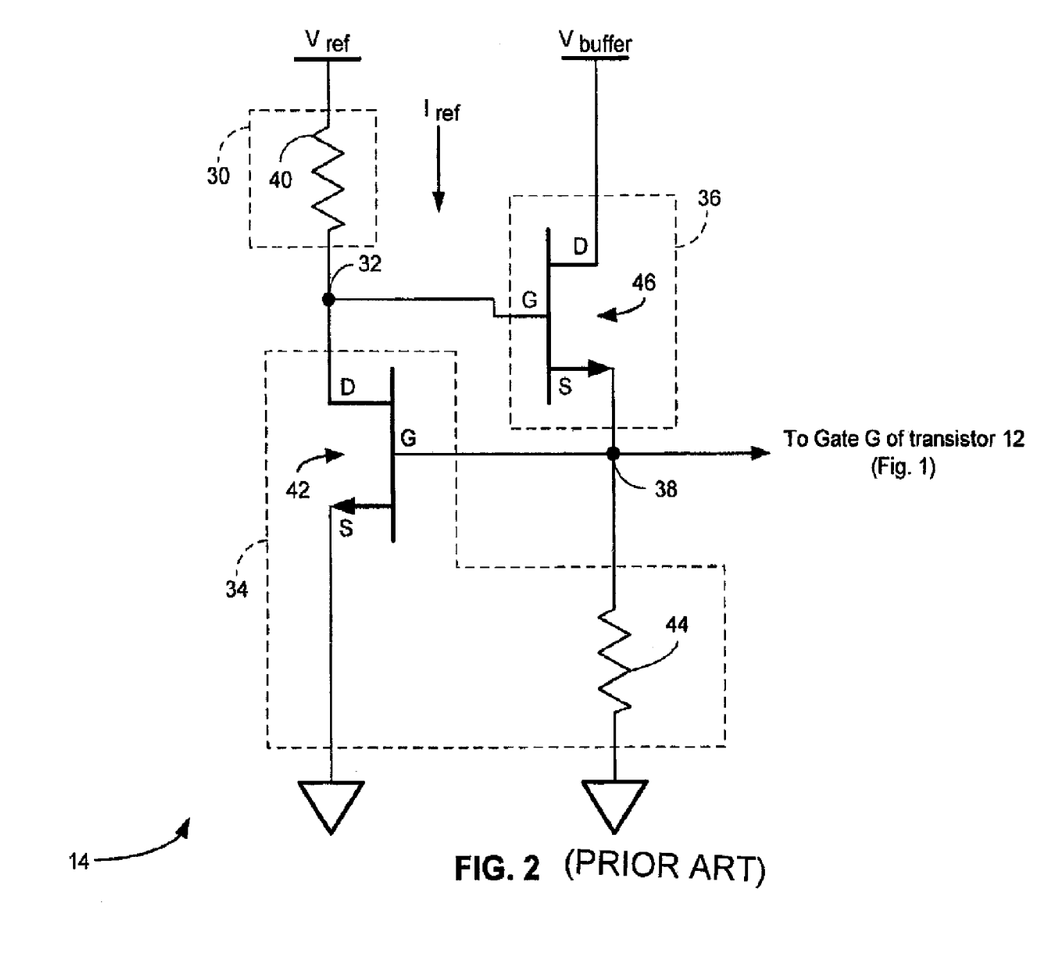
FIG. 2 is a diagram of the DC bias circuit of FIG. 1.

In operation, the transistor 12 amplifies the RF signal from the generator 16 by generating at the drain D an RF current that "rides" on $I_{bias}$. This RF current generates Vo, which "rides" on the DC bias voltage established by $I_{bias}$ FIG. 2 is a diagram of the bias circuit 14 of FIG. 1. Together, the transistor 12 and the circuit 14 form a conventional buffered Widlar current mirror.

The bias circuit 14 includes a current source 30 (here a reference resistor as discussed in the proceeding paragraph), a reference node 32, a reference stage 34, a buffer stage 36, and a bias node 38.

The current source 30 includes a resistor 40, which sources a reference current $I_{ref}$ to the reference node 32. $I_{ref}$ is proportional to the supply voltage $V_{ref}$ and inversely proportional to the value of the resistor 40.

Alternately, the current source 30 may include a diode-connected or fixed-bias transistor (neither shown in FIG. 2).

The reference stage 34 includes a reference field-effect GaAs transistor 42, which is matched to the amplifier transistor 12 of FIG. 1, and includes a resistor 44. Typically, the transistors 12 and 42 are disposed on the same integrated circuit (IC) die, which results in the transistors being closely matched.

The buffer stage 36 includes a buffer field-effect GaAs transistor 46, which is matched to the transistors 12 and 42 and which has approximately the same channel dimensions as the reference transistor 42.

The buffer transistor 46 is configured as a source follower between the reference node 32 and the bias node 38, and the buffer supply voltage $V_{buffer}$ may be the same as or different than $V_{ref}$.

Operation of the amplifier stage 10 is now discussed where the stage has the transistor parameters, resistor values, and supply-voltage values as respectively shown in Tables I-III.

TABLE I

|  | Reference Transistor 42 | Buffer Transistor 46 | Amplifier Transistor 12 |
|---|---|---|---|
| Channel Width (assuming all transistors have the same channel length) | 100 μm | 100 μm | 960 μm |

TABLE II

|  | Resistor 40 | Resistor 44 |
|---|---|---|
| Resistance | 7.12 KΩ | 1.39 KΩ |

TABLE III

|  | $V_{ref}$ | $V_{buffer}$ |
|---|---|---|
| Voltage | 1.0 V | 3.6 V |

The reference transistor 42 sinks the current $I_{ref}$, and generates across its gate (G)-to-source (S) junction, and thus across the resistor 44, the bias voltage $V_{bias}$, which is proportional to $I_{ref}$. Because the reference transistor 42 and the amplifier transistor 12 (FIG. 1) are matched and have the same gate-to-source voltage $V_{bias}$, then ideally:

$$I_{bias} = S_{predicted} \cdot I_{ref} \qquad (1)$$

where $S_{predicted}$ is a scale factor that depends on the channel dimensions of the transistors 12 and 42—$S_{predicted}$ may depend on other quantities such as the output conductances of transistors 12 and 42, but these dependencies are ignored for purposes of this analysis. For example, per Table I, where the transistors 12 and 42 have the same channel length L, the transistor 42 has a channel width $W_{42}=100$, and the transistor 12 has a channel width $W_{12}=960$, then ideally:

$$S_{predicted} = W_{12}/W_{42} = 960/100 = 9.6 \qquad (2)$$

Therefore, from equations (1) and (2), one would anticipate $I_{bias} = 9.6 \cdot I_{ref}$.

Unfortunately, as discussed below, the amplifier stage 10 may experience one or more problems related to the biasing of the amplifier transistor 12.

Figures 3, 4:
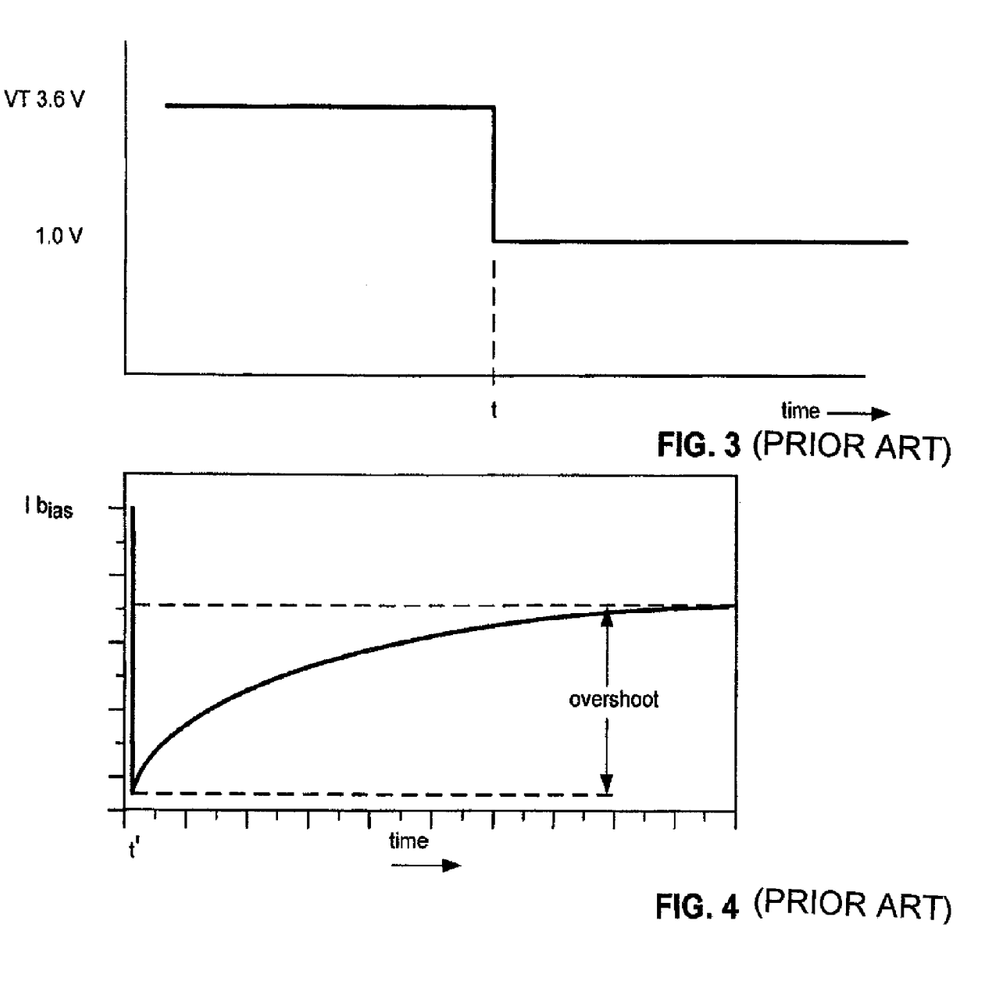
FIG. 3 is a plot of $V_{transmission}$ of FIG. 1 versus time during a high-to-low transition of $V_{transmission}$.
FIG. 4 is a plot of $I_{bias}$ of FIG. 1 versus time in response to the high-to-low transition of $V_{transmission}$ (FIG. 3).

FIG. 3 is a plot of the supply voltage $V_{transmission}$ of FIG. 1 versus time, where, as further discussed below, $V_{transmission}$ transitions from a voltage level $V_{high}=3.6$ V to a voltage level $V_{low}=1.0$ V at a time t.

FIG. 4 is a plot of the bias current $I_{bias}$ of FIG. 1 versus time, where, as further discussed below, $I_{bias}$ experiences an undesirable transient commencing when $V_{transmission}$ transitions from $V_{high}$ to $V_{low}$.

Referring to FIGS. 1-3, a system that includes the amplifier stage 10 may switch $V_{transmission}$ between two voltage levels $V_{high}$ and $V_{low}$ depending on the transmitting-power requirements. For example, if a remote receiver (not shown) is relatively close to the system, then the system may reduce the power at which it transmits the RF signal by switching $V_{transmission}$ to $V_{low}$. If the system is battery powered, then switching $V_{transmission}$ to $V_{low}$ when a low transmission power is sufficient may prolong the battery life. Conversely, if the remote receiver is relatively far away from the system, then the system may increase the power at which it transmits the RF signal by switching $V_{transmission}$ to $V_{high}$.

But referring to FIG. 4, switching $V_{transmission}$ from $V_{high}$ to $V_{low}$ causes $I_{bias}$ to experience a transient response that significantly overshoots its settled value, for example by 45% or more, and that has a significant duration (e.g., ~100 microseconds).

It has been theorized that a cause for this spiking of $I_{bias}$ may be charge traps that are present in the GaAs amplifier transistor 12 (FIG. 1) and that temporarily alter the threshold voltage of the amplifier transistor in response to the switching of $V_{transmission}$. When $V_{transmission}$ switches, the voltage at the drain node D of the amplifier transistor 12 changes. But the cumulative voltage across the charge traps, which act like capacitors, does not change instantaneously. Therefore, this charge-trap voltage temporarily alters the threshold voltage of the amplifier transistor 12, thus causing a change in $I_{bias}$ even though $V_{bias}$ is unchanged.

As the charge traps rebalance their charge, $I_{bias}$ increases back toward its previous level, but settles at a new, lower level because $I_{bias}$ has a dependence on the voltage at the drain D of the transistor 12.

Although not shown in FIG. 4, switching $V_{transmission}$ from $V_{low}$ to $V_{high}$ causes $I_{bias}$ to experience a transient response having a positive overshoot and duration similar (but having opposite polarity in the case of the overshoot) to those of the negative transient.

Unfortunately, the overshoot, duration, or both the overshoot and duration of such a transient in $I_{bias}$ may render the amplifier stage 10 unsuitable for some applications. For example, the system incorporating the stage 10 may need to halt transmission of the RF signal for the duration of the transient, and this may limit the data-transmission rate to below a desired rate.

Still referring to FIGS. 1-4, a related problem is that due to the transistor output conductance, the difference between the quiescent (i.e., settled) values for $I_{bias}$ at $V_{transmission}=V_{high}$ and $V_{transmission}=V_{low}$ may be too large for some applications for which one might otherwise use the amplifier stage 10.

Figure 5:
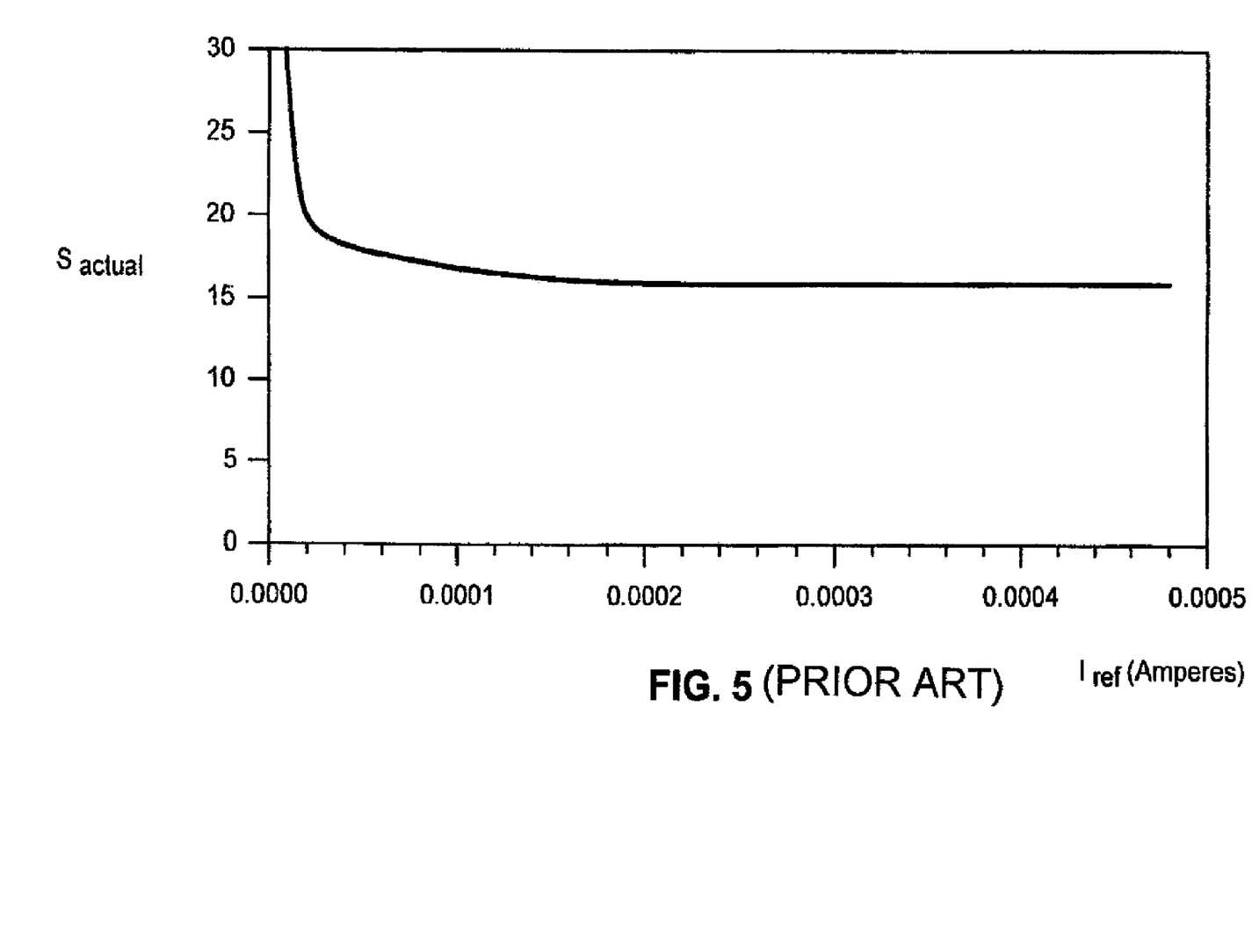
FIG. 5 is a plot of the magnitude of the actual scale factor $s_{actual}$ versus the magnitude of $I_{ref}$ for the RF amplifier stage of FIGS. 1 and 2.

FIG. 5 is a plot of the actual scale factor $s_{actual}(=I_{bias}/I_{ref})$ versus the magnitude of $I_{ref}$ for the above-described implementation of the amplifier stage 10 of FIG. 1.

Referring to FIGS. 1, 2, and 5, another problem with the stage 10 is that the actual scale factor $s_{actual}$ between $I_{bias}$ and $I_{ref}$ may differ significantly from the value of $s_{predicted}$ calculated from equation (2), and this difference may cause the actual value of $I_{bias}$ to differ significantly from the design value of $I_{bias}$.

For example, where $s_{predicted}=(W_{12})/(W_{42})=9.6$ per equation (2), one would expect $I_{bias} \approx 10 \cdot I_{ref}$ (scale factor $s_{actual} \approx 10$) from equation (1).

But referring to FIG. 5, a computer simulation shows that for 0.1 milliampere (mA) $\leq I_{ref} \leq 4.5$ mA, $18 \geq s_{actual} \geq 16$, which is an increase of 60% -80% from the value of $s_{predicted} \approx 10$ given by equation (2). This increase results in the actual value of $I_{bias}$ being approximately 1.5-2 times greater than the value predicted by equations (1) and (2).

It has been theorized that one cause of this discrepancy between the value of $s_{predicted}$ given by equation (2) and the value of $s_{actual}$ is the relatively low voltage (e.g., less than 1.0 V) at the drain D of the reference transistor 42. At this relatively low drain voltage, the transistor 42 operates closer to its resistive, or triode, region. When the transistor 42 operates in its triode region, $I_{ref}$ is much more dependent on the drain voltage than it is when the transistor operates in its saturation region. Therefore, for equation (2) to yield an accurate value for $s_{predicted}$ while the transistor 42 is operating in its triode region, the DC voltage at the drain D of the transistor 12 must substantially equal the DC voltage at the drain D of the transistor 42. But because during operation of the amplifier stage 10 the voltage at the drain of the transistor 12 is typically higher than the voltage at the drain of the transistor 42, equation (2) may yield a relatively inaccurate value for $s_{predicted}$.

SUMMARY

An embodiment of a circuit for biasing a transistor includes reference and bias nodes, and includes buffer, reference, and feedback stages. The reference node receives a reference current, and the bias node, which is for coupling to the transistor, carries a bias signal. The buffer stage buffers the reference node from the bias node. The reference stage generates the bias signal from the reference current, and the bias signal causes the transistor to conduct a bias current that is proportional to the reference current. And the feedback stage is coupled between the reference and bias nodes.

As compared to known bias circuits, such a bias circuit may reduce the amplitude and duration of a transient overshoot in the bias current of a transistor when the DC component of the transistor's drain voltage transitions from one value to another value.

Such a bias circuit may also reduce the difference between the values of the bias currents through the transistor for different supply voltages.

And such a bias circuit may reduce the difference between the predicted and actual values of the bias current through the transistor for a given gate-to-source voltage.

DETAILED DESCRIPTION

The following discussion is presented to enable a person skilled in the art to make and use one or more embodiments of the invention. The general principles described herein may be applied to embodiments and applications other than those detailed below without departing from the spirit and scope of the invention. Therefore the present invention is not intended to be limited to the embodiments shown, but is to be accorded the widest scope consistent with the principles and features disclosed or suggested herein.

Figure 6:
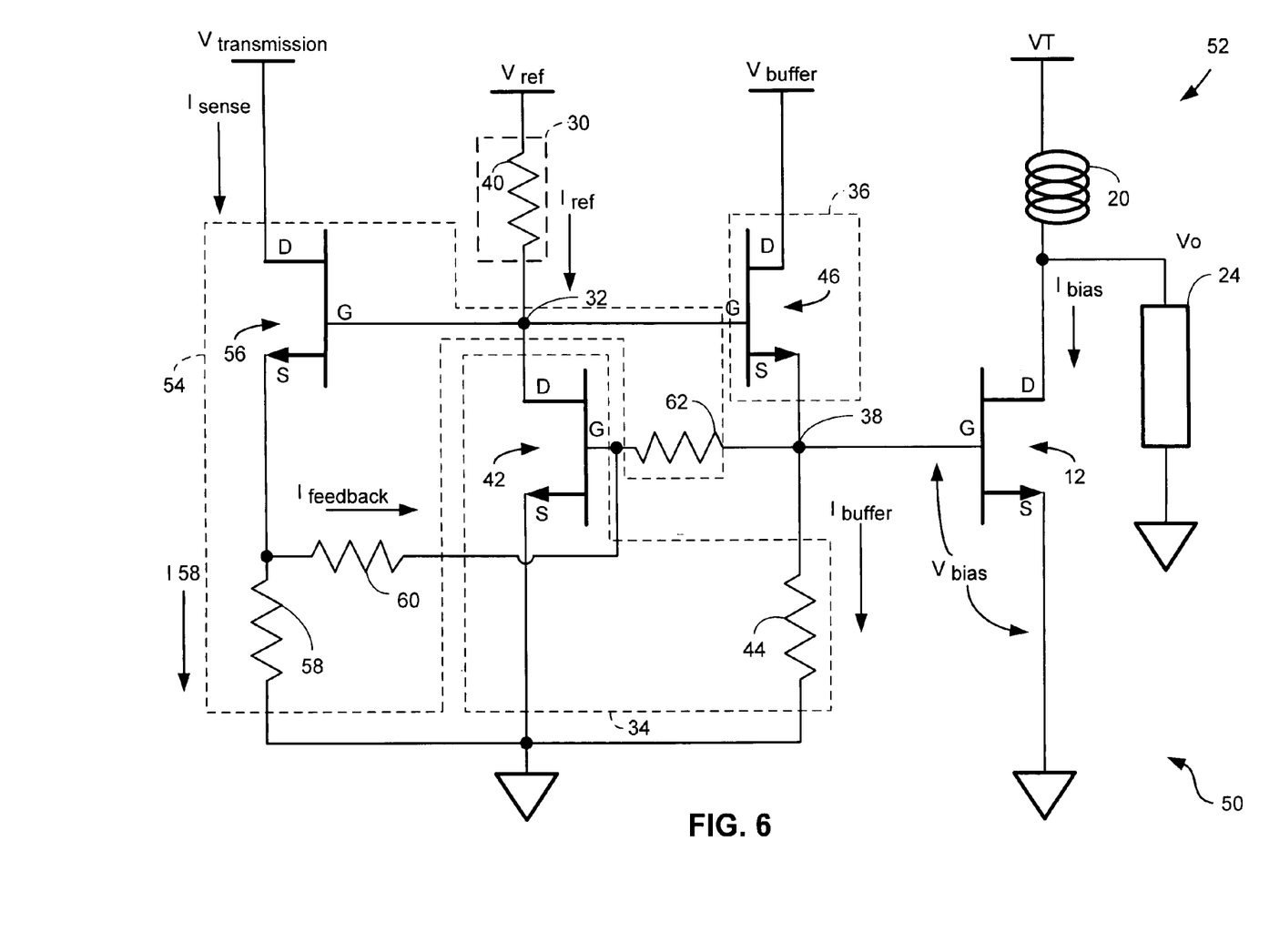
FIG. 6 is a diagram of an embodiment of an RF amplifier stage.

FIG. 6 is a diagram of an embodiment of an amplifier stage 50, where like numerals reference components common to this amplifier stage and to the amplifier stage 10 of FIG. 1. For clarity, the RF signal generator 16, DC blocking capacitor 22, and choke 18 of FIG. 1 have been omitted from FIG. 6.

The amplifier stage 50 is similar to the amplifier stage 10 of FIG. 1, except that the stage 50 includes a modified DC bias circuit 52.

As compared to the DC bias circuit 14 (FIG. 2) of the amplifier stage 10, the bias circuit 52 may, as described below, reduce the magnitude and duration of the transient overshoot in $I_{bias}$ caused by a transition of $V_{transmission}$. The bias circuit 52 may also reduce the difference between the quiescent values of $I_{bias}$ for different values of $V_{transmission}$, and may reduce the difference between the value of $I_{bias}$ predicted by equations (1) and (2) and the actual value of $I_{bias}$.

Still referring to FIG. 6, in addition to the current source 30, the reference stage 34, and the buffer stage 36, the DC bias circuit 52 includes a feedback stage 54, which includes a sense transistor 56 and feedback resistors 58, 60, and 62. The response, with proper scaling, of the sense transistor 56 is matched to the amplifier transistor 12, although the W/L ratio of the sense transistor 56 may be smaller than that of the transistor 12 so that the sense transistor draws a quiescent current $I_{sense}$ that is proportionally smaller than $I_{bias}$.

Assume that an embodiment of the amplifier stage 50 has the transistor parameters, resistor values, and supply-voltage values as respectively shown in the following Tables IV-VI.

TABLE IV

| | Amplifier Transistor 12 | Reference Transistor 42 | Buffer Transistor 46 | Sense Transistor 56 |
|---|---|---|---|---|
| Channel Width (assuming all transistors have the same channel length) | 960 μm | 100 μm | 100 μm | 100 μm |

TABLE V

| | Resistor 40 | Resistor 44 | Resistor 58 | Resistor 60 | Resistor 62 |
|---|---|---|---|---|---|
| Resistance | 7.12 KΩ | 1.39 KΩ | 1.39 KΩ | 100 Ω | 5.0 KΩ |

TABLE VI

| | $V_{ref}$ | $V_{buffer}$ |
|---|---|---|
| Voltage | 1.3 V | 0.9 v |

According to a computer analytical simulation of this embodiment of the amplifier stage 50, the quiescent currents that flow in the amplifier stage for $V_{transmission}$=1.0 V and 3.6 V are shown in Table VII.

TABLE VII

| Component | Current @ $V_{transmission}$ = 1.0 V | Current @ $V_{transmission}$ = 3.6 V |
|---|---|---|
| $I_{ref}$ | 0.1 mA | 0.1 mA |
| $I_{bias}$ | 1.09 mA | 1.33 mA |
| $I_{buffer}$ | 0.22 mA | 0.21 mA |

TABLE VII-continued

| Component | Current @ $V_{transmission}$ = 1.0 V | Current @ $V_{transmission}$ = 3.6 V |
|---|---|---|
| $I_{58}$ | 0.22 mA + 0.12 μA | 0.22 mA |
| $I_{feedback}$ | 0.12 μA | 3.34 μA |
| $I_{sense}$ | 0.22 mA | 0.22 mA |

The operation of an embodiment of the amplifier stage 50 having the transistor parameters, resistor values, supply-voltage values, and quiescent currents shown in Tables IV-VII is now discussed.

Figure 7:
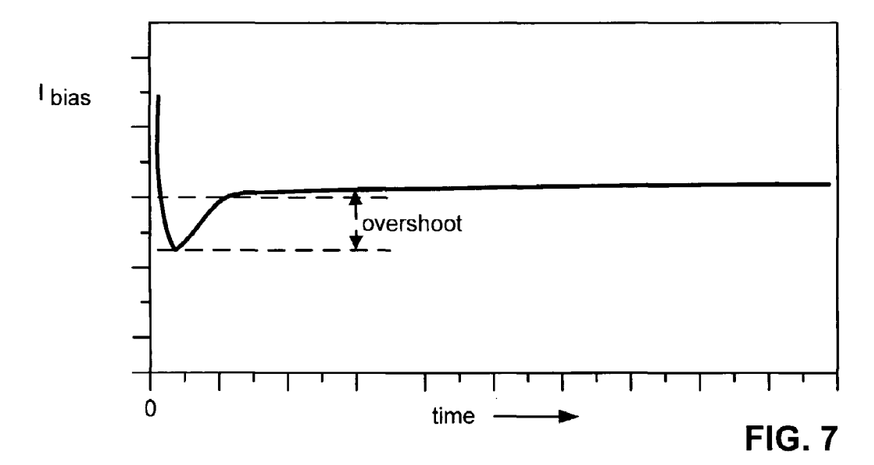
FIG. 7 is a plot of $I_{bias}$ from FIG. 6 versus time in response to a high-to-low transition of $V_{transmission}$ (FIG. 3).

FIG. 7 is a plot of $I_{bias}$ of FIG. 6 versus time in response to the high-to-low transition of $V_{transmission}$ shown in FIG. 3.

As shown in FIG. 7 and as discussed below, the DC bias circuit 52 reduces the amplitude and duration of the negative transient overshoot experienced by $I_{bias}$ when $V_{transmission}$ transitions from $V_{high}$ to $V_{low}$ as compared to the transient overshoot experienced by $I_{bias}$ of the amplifier stage 10 (FIG. 1) operating under similar conditions. In one embodiment, the bias circuit 52 reduces the amplitude of the negative overshoot by over 50%.

Because the sense transistor 56 is matched to the amplifier transistor 12 and is powered by the same supply voltage $V_{transmission}$, $I_{sense}$ also experiences a negative transient overshoot in response to the high-to-low transition of $V_{transmission}$.

The negative overshoot of $I_{sense}$ reduces the voltage across the resistor 58, and thus also reduces the voltage at the gate G of the reference transistor 42 via the feedback transistor 60.

The reduced voltage at the gate G of the reference transistor 42 reduces $I_{ref}$, and thus increases the voltage at the drain D of the reference transistor.

Figure 8:
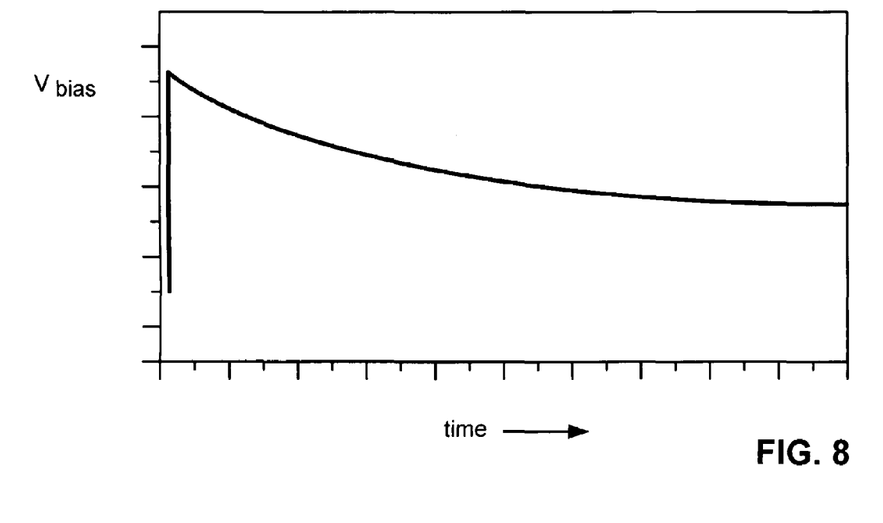
FIG. 8 is a plot of $V_{bias}$ from FIG. 6 versus time in response to a high-to-low transition of $V_{transmission}$ (FIG. 3).

As shown in FIG. 8, which is a plot of $V_{bias}$ versus time, in response to the transient overshoot of $I_{bias}$ shown in FIG. 7, the buffer transistor 46, which is configured as a source follower, couples the voltage increase at the drain D of the reference transistor 42 to the bias node 38, and thus increases $V_{bias}$ (note that FIGS. 7 and 8 have different time scales).

This increase in $V_{bias}$ causes an increase in $I_{bias}$, and this increase in $I_{bias}$ opposes, and thus reduces the amplitude and duration of, the negative transient overshoot in $I_{bias}$ caused by the high-to-low transition of $V_{transmission}$. One or more parameters of the DC bias circuit 52 may be adjusted to set the amounts by which the DC bias circuit reduces the amplitude and duration of the negative transient overshoot in $I_{bias}$.

Thereafter, $I_{bias}$ and the other currents settle to the quiescent values shown in the second column of Table VII, and $V_{bias}$ settles to a quiescent value equal to the product of $I_{buffer}$ and the value of the resistor 44.

In a similar manner, the DC bias circuit 52 may reduce the amplitude and duration of the positive transient overshoot in $I_{bias}$ when $V_{transmission}$ transitions from $V_{low}$ to $V_{high}$ as compared to the amplitude and duration of the positive transient overshoot in $I_{bias}$ of the amplifier stage 10 (FIG. 1).

Referring again to FIG. 6, using the same feedback action as described above, the DC bias circuit 52 may also reduce the difference between the quiescent values of $I_{bias}$ at $V_{transmission}=V_{high}$ and $V_{transmission}=V_{low}$ as compared to the difference between the corresponding quiescent values of $I_{bias}$ in the amplifier stage 10 of FIG. 1.

As discussed above in conjunction with FIGS. 1-2, after the negative transient overshoot caused by the transition of $V_{transmission}$ from $V_{high}$ to $V_{low}$, $I_{bias}$ in the amplifier stage 10 settles to a quiescent value that is less than the quiescent value of $I_{bias}$ when $V_{transmission}=V_{high}$.

Similarly, referring to FIGS. 6-7, after the negative transient overshoot caused by the transition of transmission from $V_{high}$ to $V_{low}$, $I_{bias}$ in the amplifier stage 50 may settle to a quiescent value that is less than the quiescent value of $I_{bias}$ when $V_{transmission} = V_{high}$.

Because the sense transistor 56 is matched to the amplifier transistor 12 and, like the amplifier transistor, has its drain D coupled to $V_{transmission}$, after the negative overshoot in $I_{sense}$ caused by the transition of $V_{transmission}$ from $V_{high}$ to $V_{low}$, $I_{sense}$ also settles toward a quiescent value that may be less than the quiescent value of $I_{sense}$ when $V_{transmission} = V_{high}$.

But this reduction in the quiescent value of $I_{sense}$ reduces the voltage across the resistor 58, and thus reduces the gate voltage of the reference transistor 42 via the feedback resistor 60.

This reduction in the gate voltage of the reference transistor 42 reduces $I_{ref}$, and thus increases the voltage at the reference node 32.

The increased voltage at the reference node 32 increases the gate voltages of the sense transistor 56 and the buffer transistor 46, and thus increases $I_{sense}$ and $V_{bias}$.

The increase in $V_{bias}$ increases $I_{bias}$; therefore, $I_{bias}$ when $V_{transmission} = V_{low}$ is closer to its previous quiescent value (when $V_{transmission} = V_{high}$) than it would be if the DC bias circuit 52 lacked the feedback stage 54.

In summary, the feedback stage 54 allows the DC bias circuit 52 to oppose, and thus lessen, the reduction in the quiescent value of $I_{bias}$ caused by the high-to-low transition of $V_{transmission}$ as compared to the corresponding reduction in the quiescent value of $I_{bias}$ of the amplifier stage 10 (FIG. 1). One can select the parameters of the DC bias circuit 52 to provide the desired quiescent value for $I_{bias}$ when $V_{transmission} = V_{low}$.

According to a similar feedback analysis, the feedback stage 54 allows the DC bias circuit 52 to oppose, and thus lessen, the increase in $I_{bias}$ caused by the low-to-high transition of $V_{transmission}$ as compared to the increase in the quiescent value of $I_{bias}$ of the amplifier stage 10 (FIG. 1). One can select the parameters of the DC bias circuit 52 to provide the desired quiescent value for $I_{bias}$ when $V_{transmission} = V_{high}$.

Based on the above analyses and depending on the component values, the transistor dimensions, and the operating parameters of the amplifier stage 50, the DC bias circuit 52 may reduce by 66% or more the difference between the quiescent values of $I_{bias}$ at $V_{transmission} = V_{low} = 1$ V and $V_{transmission} = V_{high} = 3.6$ V as compared to the difference between the quiescent values of $I_{bias}$ of the amplifier stage 10 (FIG. 1) for the same values of $V_{transmission}$.

Still referring to FIG. 6 and as discussed below, the DC bias circuit 52 may also reduce the difference between the value of $I_{bias}$ predicted by equations (1) and (2) and the actual value of $I_{bias}$ As discussed above in conjunction with FIGS. 1, 2, and 5, for a given value of $I_{ref}$, the actual ratio $S_{actual} = I_{bias}/I_{ref}$ may be greater by 80% or more than the predicted ratio $S_{predicted} = I_{bias}/I_{ref}$ for the known amplifier stage 10. This difference between $S_{predicted}$ and $S_{actual}$ indicates that for the amplifier stage 10, the actual value of $I_{bias}$ is significantly greater than the value predicted by equations (1) and (2).

One way to reduce the difference between the actual and predicted values of $I_{bias}$ is to increase the drain voltage of the reference transistor 42 so that the reference transistor operates in its linear region, not in its triode region.

But when the amplifier stage 50 is used in a low-voltage application such as the transmitter application discussed above, increasing the drain voltage of the reference transistor 42 may not be a viable option.

Another way to reduce the difference between the actual and predicted values of $I_{bias}$ is to generate a voltage offset between the gate-to-source voltages of the amplifier and reference transistors 12 and 42.

This solution is unavailable in the known bias circuit 14 (FIG. 2) because the gates G and sources S of the amplifier and reference (FIG. 1) transistors 12 and 42 are respectively coupled to the same nodes 32 and ground.

But referring to FIG. 6, the feedback resistor 62 in the DC bias circuit 52 provides a level of decoupling between the gates G of the amplifier and reference transistors 12 and 42, and thus allows the DC bias circuit to generate a voltage offset between the gate-to-source voltages of the amplifier and reference transistors. As discussed below, one can design the DC bias circuit 52 so that this voltage offset brings the actual value of $I_{bias}$ closer to the value of $I_{bias}$ predicted by equations (1) and (2).

Specifically, referring to FIG. 6 and Tables V and VII, because the current $I_{58}$ is greater than $I_{buffer}$ and because the resistors 44 and 58 have equal values, the voltage across the resistor 44 is less than the voltage across the resistor 58.

This voltage difference generates a positive value for a current $I_{feedback}$, which flows from the source S of the sense transistor 56, through the feedback resistors 60 and 62, to the bias node 38.

Therefore, $I_{feedback}$ causes the gate-to-source voltage of the reference transistor 42 to be greater than $V_{bias}$, which is the gate-to-source voltage of the amplifier transistor 12. That is, $I_{feedback}$ effectively lowers $V_{bias}$ relative to the gate-to-source voltage of the reference transistor 42.

This lowering of $V_{bias}$ relative to the gate-to-source voltage of the reference transistor 42 lowers $I_{bias}$ relative to $I_{ref}$, and thus brings $I_{bias}$ closer to the value predicted by equations (1) and (2).

Figure 9:
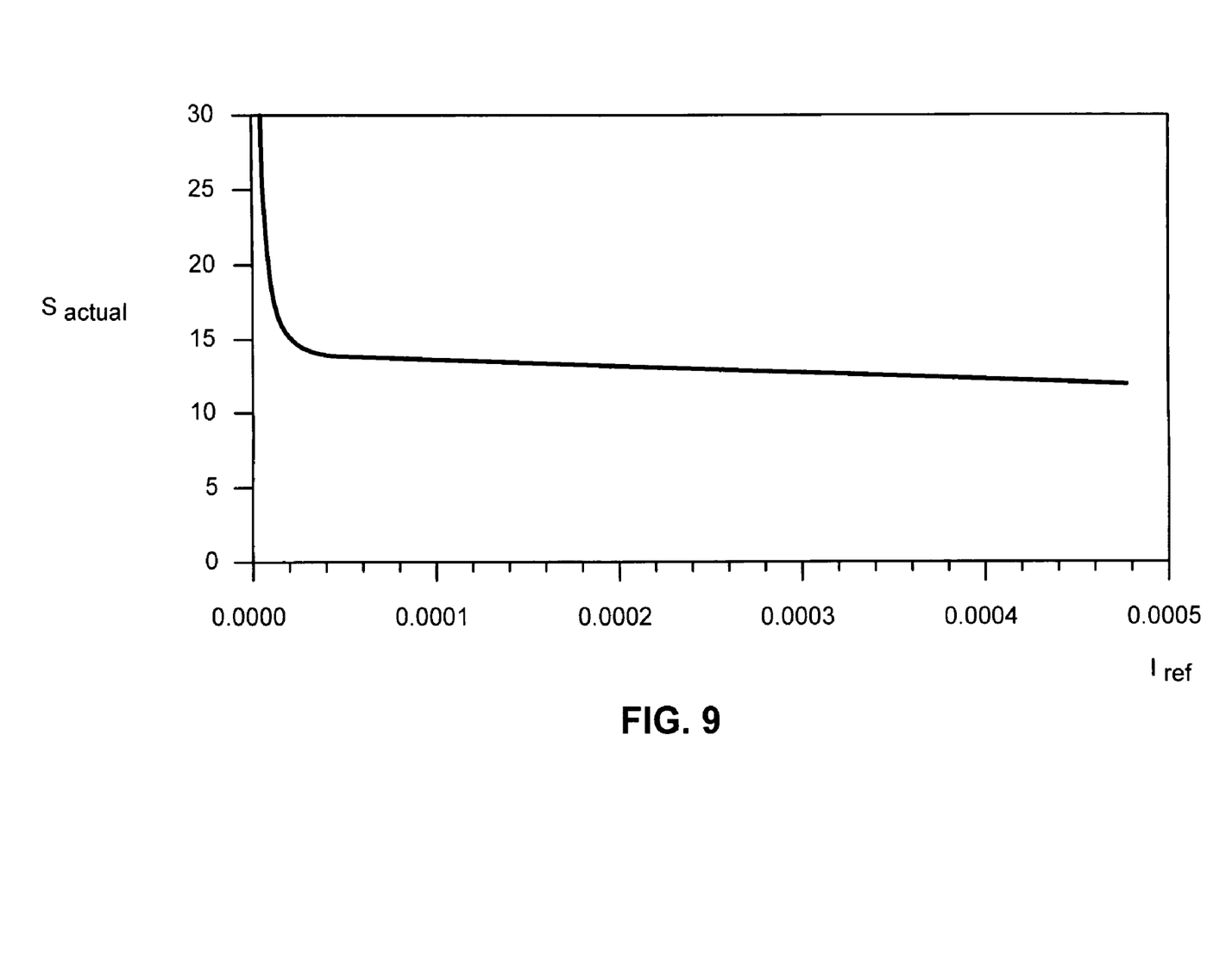
FIG. 9 is a plot of the magnitude of the actual scale factor $s_{actual}$ versus the magnitude of $I_{ref}$ for the RF amplifier stage of FIG. 6.

FIG. 9 is a plot of the actual ratio $s_{actual} = I_{bias}/I_{ref}$ versus $I_{ref}$ for the above-described embodiment of the amplifier stage 50 of FIG. 6.

As shown in FIG. 9, for 0.1 milliampere (mA) $\leq I_{ref} \leq 4.5$ mA, $13 \geq s_{actual} \geq 12.2$, which is a maximum increase in $s_{actual}$ of approximately 34% from the value of $s_{predicted} \approx 10$ given by equation (2). This is compared to a maximum increase of $s_{actual}$ approximately 80% from $s_{predicted}$ for the amplifier 10 (FIG. 1) operating under similar conditions as shown in FIG. 5.

Therefore, an embodiment of the DC bias circuit 52 of FIG. 6 brings the actual value of $I_{bias}$ closer to the value predicted by equations (1) and (2) as evidenced by the approximately 50% reduction in the maximum difference between $s_{actual}$ and $s_{predicted}$ as compared to the difference between $s_{actual}$ and $s_{predicted}$ for the DC bias circuit 14 of FIG. 1.

If the DC bias circuit 52 of FIG. 6 is to be used solely for the purpose of obtaining an accurate bias current in transistor 12, and no switching of $V_{transmission}$ is anticipated, then a further embodiment is possible. This is can be done by simplifying the feedback stage 54. Because the feedback stage 54 includes a source follower (i.e., the transistor 56), its output ideally follows its input. In other words, the feedback voltage at the source S of transistor 56 follows closely the voltage at its gate, which is connected to node 32. Therefore an alternate embodiment can be effected by eliminating transistor 56 entirely, connecting node 32 directly to the end of resistor 60 that is at its juncture with resistor 58, and eliminating resistor 58. The only adjustment to resistor 60 might be to increase its value from 100Ω to, e.g., 5.0 KΩ, to recover the nominally high input impedance of the removed source-follower transistor 56. Without resistor 58, the reference node 32 is still higher in voltage than the bias node 38, thus enabling $I_{feedback}$ to flow and raise gate G of transistor 42 above the $V_{bias}$ of transistor 12 at bias node 38. The resulting bias difference at the gates G of transistors 12 and 42 may reduce the difference between $s_{actual}$ and $s_{predicted}$ as well as the unmodified feedback stage 54 does.

Referring to FIG. 6, alternate embodiments of the amplifier stage 50 and the DC bias circuit 52 are contemplated. For example, one can form the dual of the amplifier 50 by replacing the transistors 12, 42, 46, and 56 with p-channel transistors, and by reversing the polarities of the voltages $V_{transmission}$, $V_{buffer}$, and $V_{ref}$. Furthermore, one can couple the sources S of the transistors 12 and 42 and couple the resistors 44 and 58 to voltages other than ground (0 V). Moreover, the DC bias circuit 52 may include components other than those shown, such as one or more capacitors in parallel with respective ones of the resistors. In addition, the transistors 12, 42, 46, and 56 may be other than GaAs transistors. Furthermore, one can change one or more of the transistor dimensions, component values, and voltage values shown in the Tables IV-VI to obtain different quiescent values for $I_{ref}$ and $I_{bias}$. Moreover, one or more of the transistors 12, 42, 46, and 56 may be a bipolar transistor. In addition, the amplifier stage 50 may be used in systems other than cell phones and wireless modems.

From the foregoing it will be appreciated that, although specific embodiments have been described herein for purposes of illustration, various modifications may be made without deviating from the spirit and scope of the invention. Furthermore, where an alternative is disclosed for a particular embodiment, this alternative may also apply to other embodiments even if not specifically stated.

What is claimed is:

1. A circuit for biasing an amplifier transistor, the circuit comprising:
   a reference node operable to receive a reference current;
   a bias node operable to be coupled to the transistor and to carry a bias signal;
   first, second, third, and fourth supply nodes, the amplifier transistor operable to be coupled to the first supply node;
   a current source coupled between the second supply node and the reference node and operable to generate the reference current;
   a buffer stage having a buffer input terminal coupled to the reference node and having a buffer output terminal coupled to the bias node, wherein the buffer stage comprises a buffer transistor having a first terminal coupled to the third supply node, a second terminal coupled to the buffer output terminal, and a control terminal coupled to the buffer input terminal;
   a reference stage coupled to the reference and bias nodes and operable to generate the bias signal from the reference current, the bias signal operable to cause the transistor to conduct a bias current that is proportional to the reference current, wherein the reference stage comprises,
   a reference transistor having a first terminal coupled to the reference node, a second terminal coupled to the fourth supply node, and a control terminal, and
   a first impedance element serially coupled between the bias node and the fourth supply node; and
   wherein the feed back stage comprises,
   a feedback transistor having a first terminal coupled to the first supply node, a second terminal, and a control terminal coupled to the reference node,
   a second impedance element coupled between the second terminal of the feedback transistor and the fourth supply node,
   a third impedance element coupled between the second terminal of the feedback transistor and the control terminal of the reference transistor, and
   a fourth impedance element coupled between the control terminal of the reference transistor and the bias node.

2. The circuit of claim 1, wherein the reference transistor is a reference field-effect transistor.

3. The circuit of claim 1, wherein the current source comprises a first resistive element coupled between the second supply node and the reference node and operable to conduct the reference current;
   wherein the first impedance is a second resistive element,
   wherein the second impedance is a third resistive element,
   wherein the third impedance is a fourth resistive element, and
   wherein the fourth impedance is a fifth resistive element.

4. The circuit of claim 1, further comprising a sense element that is operable to:
   sense a change in the bias current through the amplifier transistor; and
   cause the reference stage to oppose the change in the bias current by adjusting the bias signal.

5. The circuit of claim 1, wherein the feedback transistor is operable to cause the reference transistor to oppose a change in the bias signal.

6. The circuit of claim 1, wherein at least one of the first, second, third, and fourth supply nodes is the same as another one of the first, second, third, and fourth supply nodes.

* * * * *